United States Patent
Shiba

(10) Patent No.: US 7,015,051 B2
(45) Date of Patent: Mar. 21, 2006

(54) METHOD FOR INSPECTING SEMICONDUCTOR DEVICE

(75) Inventor: Shigemitsu Shiba, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 13 days.

(21) Appl. No.: 10/879,060

(22) Filed: Jun. 30, 2004

(65) Prior Publication Data

US 2005/0012923 A1 Jan. 20, 2005

(30) Foreign Application Priority Data

Jul. 15, 2003 (JP) .............................. 2003-274511

(51) Int. Cl.
*H01L 31/26* (2006.01)
*H01L 21/66* (2006.01)

(52) U.S. Cl. .............................. 438/14; 438/16; 257/40
(58) Field of Classification Search ................. 438/14, 438/15, 16; 257/40, 48; 136/212
See application file for complete search history.

(56) References Cited

U.S. PATENT DOCUMENTS

| | | | |
|---|---|---|---|
| 5,422,498 A | 6/1995 | Nikawa et al. ................ 257/48 |
| 5,708,371 A * | 1/1998 | Koyama ....................... 324/752 |
| 5,952,837 A | 9/1999 | Koyama ....................... 324/752 |
| 6,444,895 B1 * | 9/2002 | Nikawa ....................... 136/212 |
| 2002/0106820 A1 | 8/2002 | Nikawa ....................... 438/14 |

FOREIGN PATENT DOCUMENTS

DE 197 25 679 A1 1/1999

OTHER PUBLICATIONS

Konuma, Minouri and Mitsuyoshi Shibata, Eds. "Insight Into Semiconductor Laser," 2$^{nd}$ Edition, Kougakutosho Ltd., May 25, 1998. Pp. 107-140, with English language translation, pp. 1-56.

Schurig, Thomas, et al. "Nondestructive Wafer Inspection utilizing SQUIDs," Institute of Physics Conference Series, IOP Publishing, Ltd., GB, No. 160, Sep. 7, 1997. Pp. 149-152.

European Search Report dated Oct. 14, 2004, issued in corresponding European patent appln. No. 04 01 5767.9, forwarded in a Communication dated Oct. 26, 2004.

\* cited by examiner

*Primary Examiner*—Phuc T. Dang
(74) *Attorney, Agent, or Firm*—Fitzpatrick, Cella, Harper & Scinto

(57) ABSTRACT

A wafer is irradiated with laser light having a wavelength which is transmitted through an inside of a crystal of the wafer and does not generate an electromotive force due to photo-excitation while the laser light is scanned. When a temperature of the wafer is increased by the irradiation, a thermo-electromotive force is generated in a crystalline abnormal part of the wafer by a Seebeck effect. A defect inside the crystal is detected such that the thermo-electromotive force is detected by a change in voltage or current which appears between an anode and a cathode of the wafer and the thermo-electromotive force is displayed on a CRT.

4 Claims, 6 Drawing Sheets

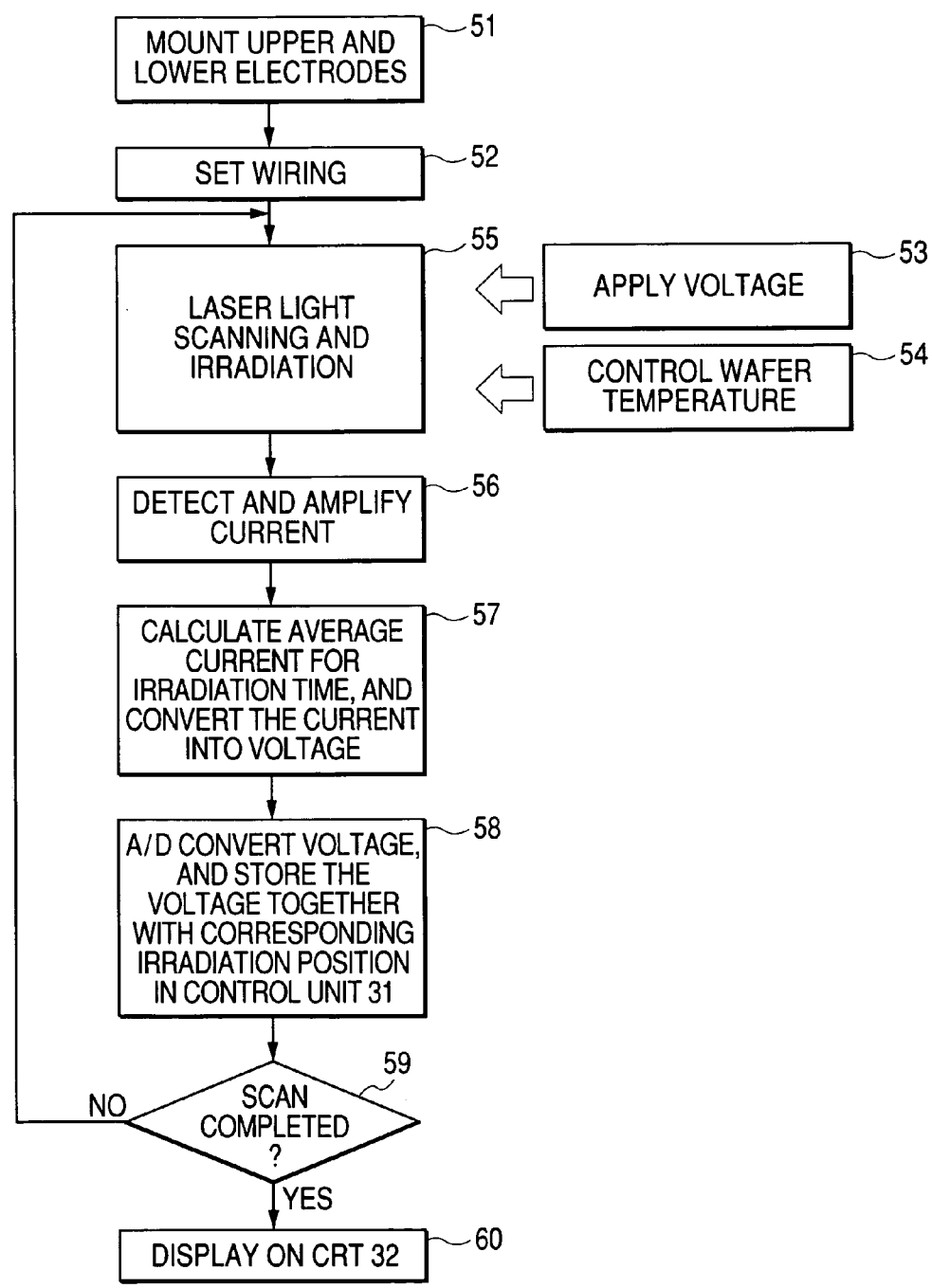

METHOD FOR INSPECTING SEMICONDUCTOR DEVICE

BACKGROUND OF THE INVENTION

1. Field of the Invention

The present invention relates to a method and an apparatus for observing, analyzing, and inspecting a crystal defect, which are suitable for use in the analysis and inspection of a crystal defect, a junction breakage caused by an electrical stress, or the like, inside a wafer in which semiconductor device chips, in particular, compound-semiconductor laser diode device chips are integrated.

2. Related Background Art

A typical compound-semiconductor laser diode device mainly includes laser diode chips in which a stacked structure made of several kinds of semiconductors is formed. An oscillator (stripe) is provided in the laser diode chip. The oscillator confines laser light and amplifies the laser light by resonance. Many technologies have been developed for failure analysis and inspection of the compound-semiconductor laser diode (hereinafter, referred to as a laser diode).

The inspection of the laser diode includes an electrical and optical characteristics measurement. A near field pattern (NFP) observation method is well known as the electrical and optical characteristics measurement. In the NFP observation method, a light-emission stage in a laser-light emission position at an end face of the laser diode chip is two-dimensionally found with an infrared camera to observe a light-emission shape of the laser diode, and an abnormality is discriminated by comparing the laser diode of the inspection subject to the nondefective unit. The observation of the NFP observation method is performed in a manner that magnifies the light-emission position with an optical microscope while the laser diode chip is caused to emit the laser light, finds the NFP of the light-emission position with the infrared camera, and displays the NFP on a monitor screen (for example, see "Insight into Semiconductor Laser" 2nd edition, edited by Minoru KONUMA and Mitsuyoshi SHIBATA, Kougakutosho Ltd., May 25, 1998)).

An aging method for screening a defective unit due to the crystal defect is also the well-known art. In the aging method, the defective unit is discriminated from a change in an optical output after a predetermined time has elapsed.

In the conventional method and apparatus for analyzing and inspecting a semiconductor laser diode device described above, there are the following problems.

In the method for measuring electrical and optical characteristics, although the defective unit, which does not satisfy initially-required design specifications, can be detected, the defective unit which is degraded with time by the crystal defect located inside the chip cannot be detected. In the NFP observation method, because only the end face reflecting the laser light is observed, only a trace of catastrophic optical damage (COD), which appears as optical information on the end face can be detected, and it is difficult to check an abnormality such as a crystal defect located inside the chip.

In the aging method, it is necessary to perform operations for all the finished units in a high temperature environment and it is also necessary to pay close attention to handling of the device or the apparatus so that the breakage of the device is not generated during the aging. Further, sometimes it takes several hours to tens of hours to perform the aging. Therefore, from a viewpoint of manufacturing cost, the aging method has a large problem. Particularly, the requirement of the aging for long hours becomes a large obstacle in mass production and reduction of the manufacturing cost cannot be expected.

Further, in these conventional inspection methods, basically, it is necessary to perform the inspection in the state in which each chip is cut out from the wafer or in the state in which the device is almost finished. Therefore, it requires time to be spent to perform the inspection in the case of total inspection, and it is impossible to completely detect the defective unit in the case of a sampling inspection. When the defective unit is detected, there is also the problem that the processes through which the defective unit is produced go to waste.

SUMMARY OF THE INVENTION

In view of the foregoing, it is an object of the invention to provide a method and an apparatus which can simply and securely perform the observation and the detection of an abnormality, such as a crystal defect and the breakage trace inside a semiconductor device, such as a laser diode chip, while the semiconductor device is in the wafer state.

A method of inspecting a semiconductor device chip wafer of the invention includes a step of irradiating a wafer in which semiconductor device chips are integrated with a quantum beam having a wavelength which is transmitted through an inside of a crystal of the wafer and does not generate electromotive force due to excitation while the quantum beam is scanned, and a step of detecting the thermo-electromotive force generated in a crystalline abnormal part of the wafer by the irradiation by a change in voltage or current which appears between a surface of and a backside of the wafer and of displaying the thermo-electromotive force.

An apparatus for inspecting a semiconductor device chip wafer of the invention includes irradiating means for irradiating a wafer in which semiconductor device chips are integrated with a quantum beam having a wavelength which is transmitted through an inside of a crystal of the wafer and does not generate electromotive force due to excitation while the quantum beam is scanned, and detecting and displaying means for detecting the thermo-electromotive force generated in a crystalline abnormal part of the wafer by the irradiation by a change in voltage or current which appears between a surface of and a backside of the wafer and for displaying the thermo-electromotive force.

When the defective point of the semiconductor device is irradiated with the quantum beam to heat the defective (abnormal) point, the thermal-electromotive force is generated by a Seebeck effect (which will be discussed in more detail below) and the current transiently passes through the wafer. The defect located in the oscillator and a peripheral area of the oscillator in the semiconductor device can be easily detected with high reliability by detecting intensity of the current.

When the change in voltage or current is detected, a forward bias or a reverse bias can be applied between an anode and a cathode of the wafer. Therefore, detection sensitivity of the abnormal part can be increased and the reliability of the inspection can be improved.

When the change in voltage or current is detected, a temperature of the wafer is controlled to the temperature in which the generation of the current is substantially maximized. Therefore, the detection sensitivity of the abnormal part can be increased and the reliability of the inspection can be improved.

The inspection result can be visualized by displaying a relationship between an irradiation position of the laser light and the change in voltage or current corresponding to he irradiation position in a form of a display image. Therefore, the defect position can be visually directly comprehended and user-friendliness and reliability of the inspection can be improved.

A single-chip electrode of each laser diode chip is previously provided in only one of the surface of and the backside of the semiconductor laser diode wafer, and the irradiation can be performed from the surface in which the single-chip electrode is not provided. Alternatively, a single-chip electrode having an aperture along an oscillator of each laser diode chip is previously provided in at least one of the surface of and the backside of the wafer, and the irradiation can be performed through the aperture. Therefore, the single-chip electrode finally required in the semiconductor laser diode can be previously mounted, and the method contributes to simplification of the manufacturing process.

It is also possible that the wafer is previously divided into a plurality of pieces to perform the inspection in each of the divided wafers. Therefore, even when there is a limitation of a size of the inspection apparatus, the invention can be effectively realized.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 2 is a flow chart of a method for producing a semiconductor of the invention;

DETAILED DESCRIPTION OF THE PREFERRED EMBODIMENTS

The accompanying drawings, which are incorporated in and constitute a part of the specification, illustrate embodiments of the invention and, together with the description, serve to explain the principles of the invention.

Figure 1:
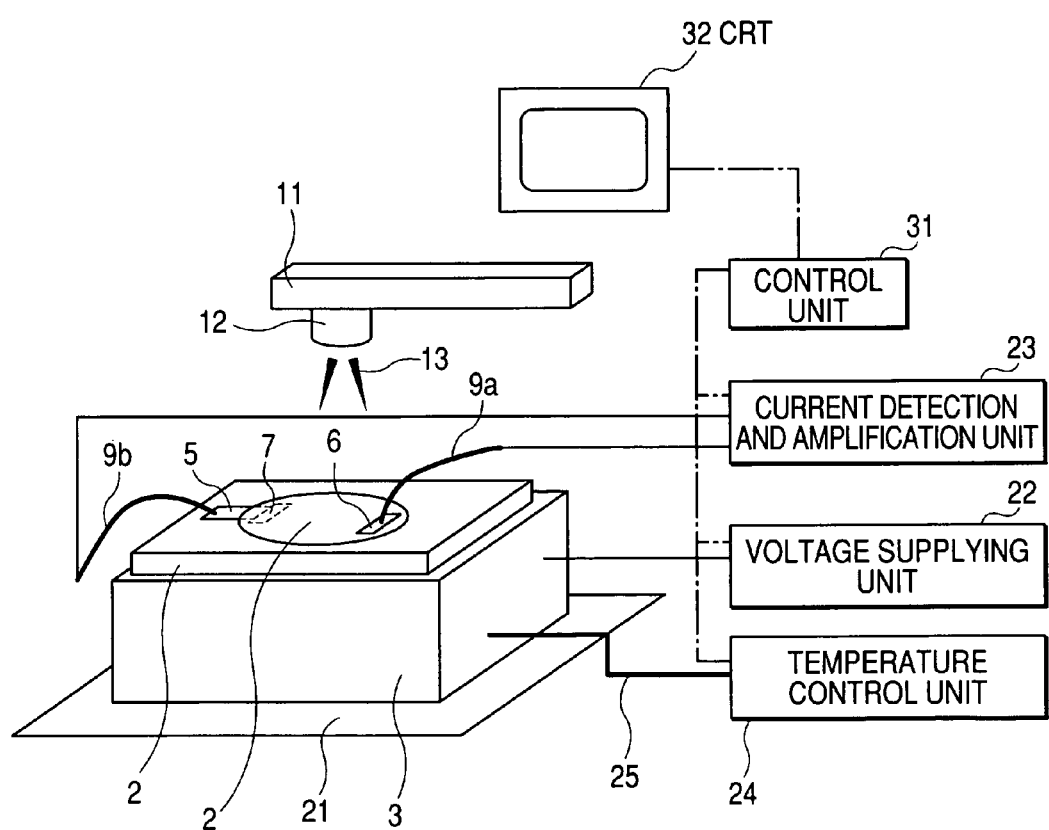
FIG. 1 is an overall view showing a configuration of an apparatus for inspecting a semiconductor device chip wafer of the invention.

Preferred embodiments of the invention will be described below referring to the accompanying drawings. FIG. 1 is an overall view showing a configuration of the apparatus for inspecting a semiconductor device chip wafer according to an embodiment of the invention.

A sample stage 21 is one on which the semiconductor device chip wafer (hereinafter, referred to as wafer 2), which is of a sample, is set. The wafer 2, in which the compound-semiconductor laser diode chips (hereinafter, referred to as laser diode chips 1) are integrated, is set on and fixed to the sample stage 21. The whole of the wafer 2 can become a single inspection subject. In view of the limitation of the inspection apparatus, it is also possible to previously divide the wafer 2 into the proper number of pieces having a proper size, for example, by the method of cutting out the wafer 2 in strips in each line of laser diode chip 1.

An upper electrode 6 and a lower electrode 7 are mounted on an upper surface and a lower surface of the wafer 2, respectively. The upper electrode 6 and the lower electrode 7 are connected to an anode 9a and a cathode 9b, respectively. Each one end of the anode 9a and cathode 9b is connected to a current change detection and amplification unit 23, which detects and amplifies the change in current generated inside the wafer at the instance of the irradiation of each point in the wafer 2 with laser light 13.

The sample stage 21 is connected to a voltage supplying unit 22 which supplies voltage to the wafer 2. The sample stage 21 is also connected to a temperature control unit 24 through a heating medium pipe 25. The temperature control unit 24 controls a temperature of the wafer 2.

A laser light generation and scanning unit 11 is provided in an upper portion of the sample stage 21. The laser light generation and scanning unit 11 generates the laser light 13 and scans the laser light 13 on the wafer 2. A microscope 12 for focusing a light flux of the laser light 13 is provided between the laser light generation and scanning unit 11 and the sample stage 21. The laser light generation and scanning unit 11 and the microscope 12 can vertically observe the peripheral portion of the oscillator (not shown) located in each laser diode chip 1 of the wafer 2 in order form a top surface.

A control unit 31 is connected to the laser light generation and scanning unit 11, the current change detection and amplification unit 23, and temperature control unit 24. The control unit 31 receives pieces of information such as a scanning position of the laser light 13, the change in current of the wafer 2, the temperature of the wafer 2, and the voltage applied to the wafer 2, and performs processing of the pieces of information to store the pieces of information. The control unit 31 is also connected to CRT 32 which converts an observation result into positional information and luminance information to perform display, and the control unit 31 transmits the processed and stored result to CRT 32 if necessary.

Then, the method of inspecting the wafer 2 according to the embodiment will be described. FIG. 2 schematically shows a flow chart of the inspection method.

Figure 3A:
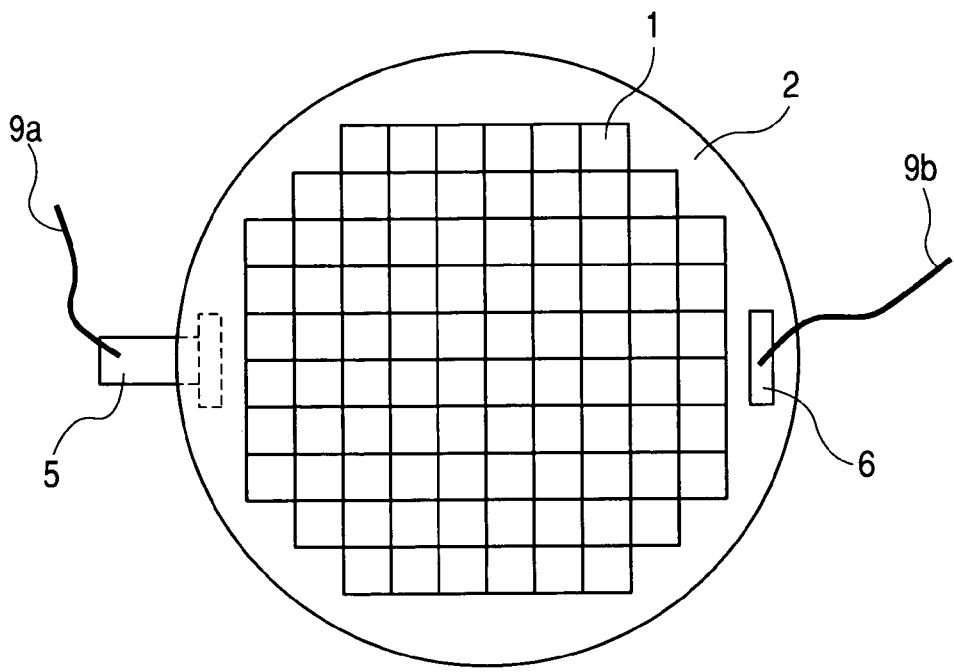
FIGS. 3A and 3B are explanatory views of an electrode mounting method according to a first embodiment of the invention.
Figure 3B:
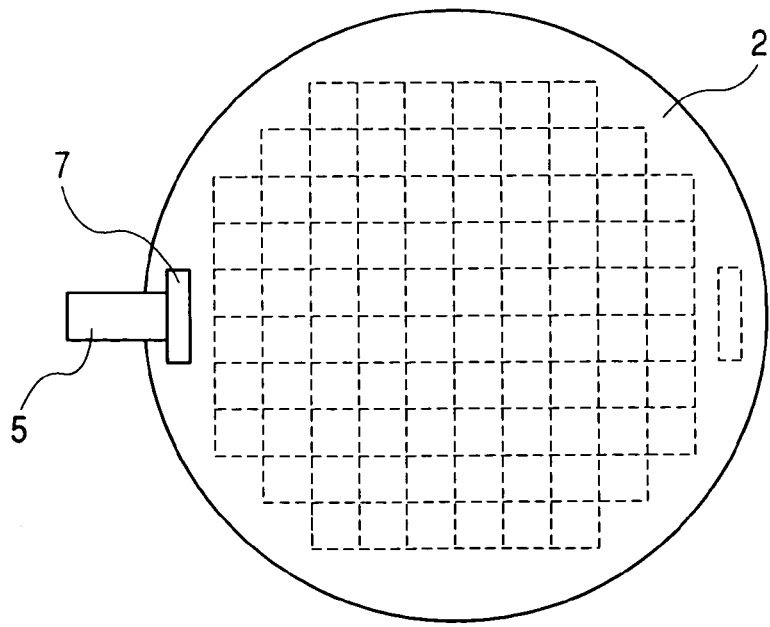

The wafer 2 is set on the sample stage 21 to mount the upper and lower electrodes 6 and 7 to the wafer 2 (Step S51). FIGS. 3A and 3B show the state in which the upper and lower electrodes 6 and 7 are mounted to the wafer 2. FIG. 3A shows the wafer 2 viewed from the upper surface side and FIG. 3B shows the wafer 2 viewed from the lower surface side. As shown in FIG. 3A, the wafer 2 is set on the sample stage 21 so that the surface on which the many laser diode chips 1 are stacked becomes the surface irradiated with the laser light, i.e., the upper surface. As shown in FIG. 3B, since the lower electrode 7 is attached on the side of the sample stage 21, a lead-out portion 5 is provided in order to perform the wiring for current detection. The upper and lower electrodes 6 and 7 are mounted to regions where the laser diode chips 1 are not formed in the wafer 2. However, dimensions and positions of the upper and lower electrodes 6 and 7 are not limited to the mode shown in FIGS. 3A and 3B, and the dimensions and the positions can be freely set within the range where the irradiation to the laser diode chips 1 is not prevented.

Then, the anode 9a is connected to the upper electrode 6 mounted to the wafer 2 and the cathode 9b is connected to the lead-out portion 5. The anode 9a and the cathode 9b are connected to the current change detection and amplification unit 23 (Step S52).

In order to increase the detection sensitivity of the abnormal part, it is effective that a reverse bias or a forward bias is applied to the wafer 2, so that the voltage is applied to the wafer 2 from the voltage supplying unit 22 (Step S53). Similarly, in order to increase the detection sensitivity of the abnormal part, the temperature of the wafer 2 is controlled by the temperature control unit 24 (Step S54). Because the thermo-electromotive force current depends on the temperature of the sample, the temperature control unit 24 controls the temperature of the wafer 2 so that generation efficiency of the thermo-electromotive force current is maximized, which allows higher-reliability inspection to be performed.

While the laser light generation and scanning unit 11 scans on the wafer 2, the laser light generation and scanning unit 11 sequentially irradiates the laser diode chips 1 with the laser light 13 (Step S55). At this point, the laser light generation and scanning unit 11 performs the scanning so as to irradiate the oscillator (not shown) inside the laser diode 1 with the laser light 13 in a direction orthogonal to a lengthwise direction of the oscillator. In order to suppress the generation of optical beam induced current (OBIC), which is of the photo-excited current, as much as possible, the laser light 13 has energy (longer wavelength) lower than a band gap of the wafer 2, which is of the observation subject, and the laser light 13 has the energy (shorter wavelength), which is sufficiently transmitted through the wafer 2.

When the wafer 2 has the abnormal part such as the crystal defect, the thermo-electromotive force current is generated due to the Seebeck effect by the irradiation of the laser light 13. The Seebeck effect means a phenomena in which an electromotive force is generated to cause passage of the current when a temperature difference exists between two contacts of a closed circuit formed by two kinds of metals. A point, which differs from the peripheral parts in physical properties or composition due to the abnormality such as the crystal defect, differs from the peripheral parts in thermal conduction or thermo-electric capacity, so that electric resistance is increased or decreased, compared with the surroundings, and the difference appears in the thermo-electromotive force. As a result, compared with the normal part, the current is changed in the abnormal part. The generated currents are respectively sent to the current change detection and amplification unit 23 from the upper electrode 6 and the lower electrode 7 through the anode 9a and the cathode 9b, and the current change detection and amplification unit 23 properly amplifies the currents (Step S56). The amplified micro current is averaged by a residence time of the laser light 13 at each scanning point to be converted into the voltage (Step S57). Then, the A/D conversion of the voltage is performed to be stored in a memory which is located in the control unit 31 and corresponds to the scanning position (Step S58). It is confirmed that the scanning of all the laser diode chips 1 on the wafer 2 is completed (Step S59), and the irradiation of the laser light 13 is ended.

Instead of the measurement of the current between the anode 9a and the cathode 9b, it is also possible to directly measure the voltage between the anode 9a and the cathode 9b.

The control unit 31 converts the voltage value corresponding to each scanning point in the memory into a luminance signal and transmits the luminance signal and transmits the luminance signal with data of the scanning point to CRT 32. CRT 32 two-dimensionally displays the data on a screen (Step S60). Therefore, the change in contrast can be observed while corresponding to the change in current caused by the irradiation of the laser light scanning (presence or absence of the abnormal part). In addition to the luminance signal, it is also possible to use pseudo-color (for example, a 256-gray-scale display). It is possible that marking can be performed by ink, or the like, to the laser diode chip 1 in which the trouble is found. Therefore, it is possible that the defective laser diode chip 1 or the wafer 2 including the defective laser diode chip 1 is caused not to proceed to the next production process.

Figure 4A:
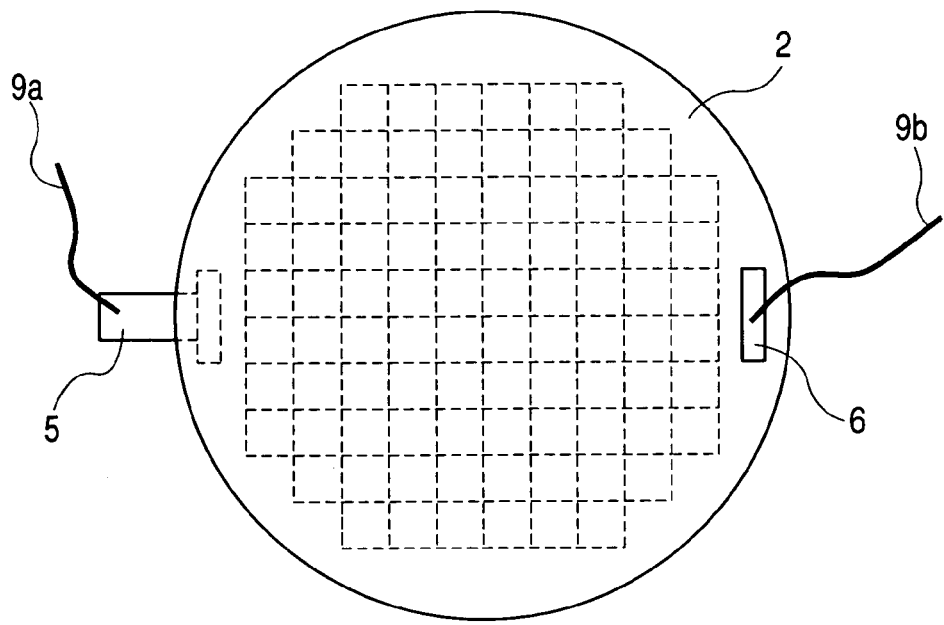
FIGS. 4A and 4B are explanatory views of the electrode mounting method according to a second embodiment of the invention.
Figure 4B:
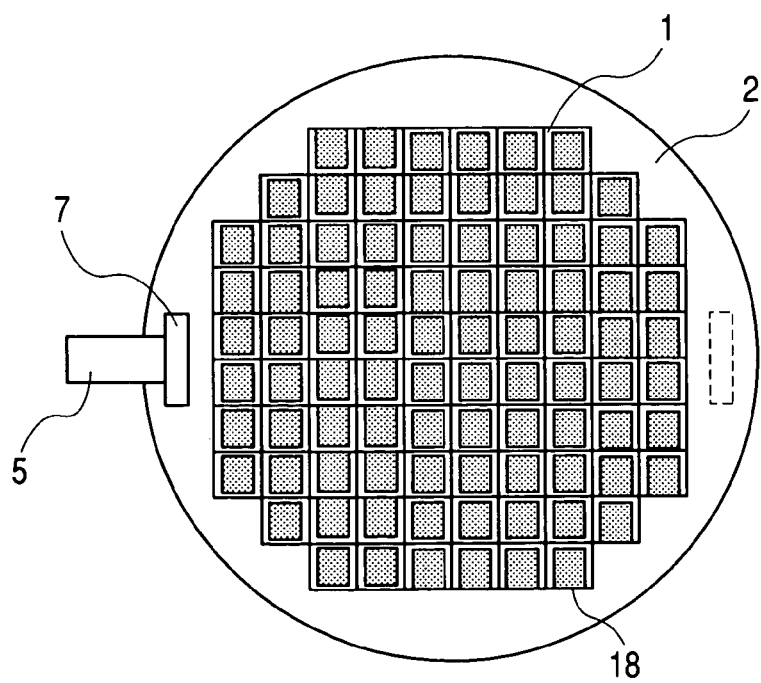

The method of inspecting a semiconductor device chip wafer according to a second embodiment of the invention will be described below. The second embodiment differs from the first embodiment in that a single-chip electrode 18a is previously formed in the laser diode chip 1 formed on the wafer 2. FIG. 4A shows the wafer 2 viewed from the upper surface side and FIG. 4B shows the wafer 2 viewed from the lower surface side. When the single-chip electrode 18a is formed, since the irradiation of the laser light 13 is interrupted by the single-chip electrode 18a and the effective inspection becomes difficult, the wafer 2 is set on the sample stage 21 so that the surface on which the single-ship electrode 18a is formed becomes the backside with respect to the irradiation direction of the laser light 13. As a result, the upper electrode 6 is mounted to the surface of the wafer 2 in which the laser diode chip 1 is not formed, and the lower electrode 7 and the lead-out portion 5 are mounted to the surface of the wafer 2 in which the laser diode chip 1 is formed. In the inspection method of the second embodiment, it is possible that the single-chip electrode 18a is previously formed. Therefore, the inspection method of the second embodiment contributes to simplification of the manufacturing process.

Figure 5A:
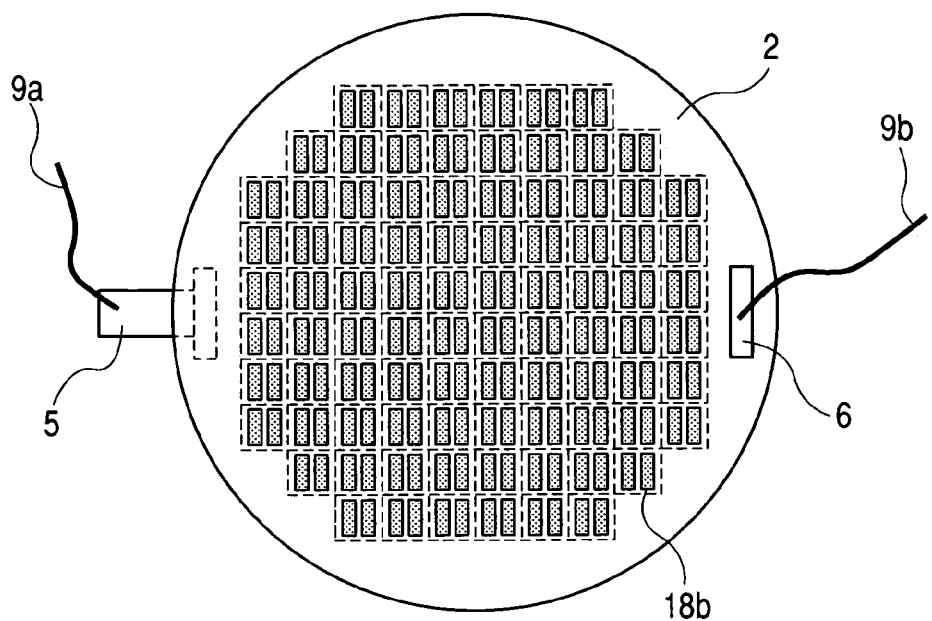
FIGS. 5A and 5B are explanatory views of the electrode mounting method according to a third embodiment of the invention.
Figure 5B:
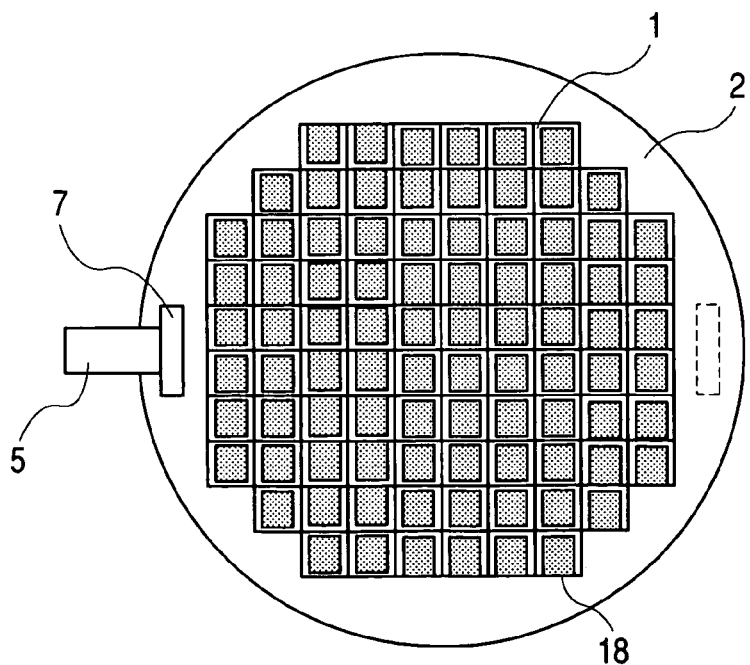

Now, the method of inspecting a semiconductor device chip wafer according to a third embodiment of the invention will be described. FIG. 5A shows the wafer 2 viewed from the upper surface side and FIG. 5B shows the wafer 2 viewed from the lower surface side. In the third embodiment, similarly to the first embodiment, the surface in which the laser diode chip 1 is formed is set to the upper surface, and the surface in which the laser diode chip 1 is not formed is set to the lower surface. A single-chip electrode 18b is previously formed in the laser diode chip 1 on the upper surface of the wafer 2. However, unlike the second embodiment, an aperture 41 is provided in the single-chip electrode 18b. Another single-chip electrode 18c is formed on the surface of the wafer 2 in which the laser diode chip 1 is not formed. The aperture is not particularly formed in the single-chip electrode 18c, and the position and the shape of the single-chip electrode 18c are formed such that the whole surface of the laser diode chip 1 is covered with the single-chip electrode 18c.

Figure 6:
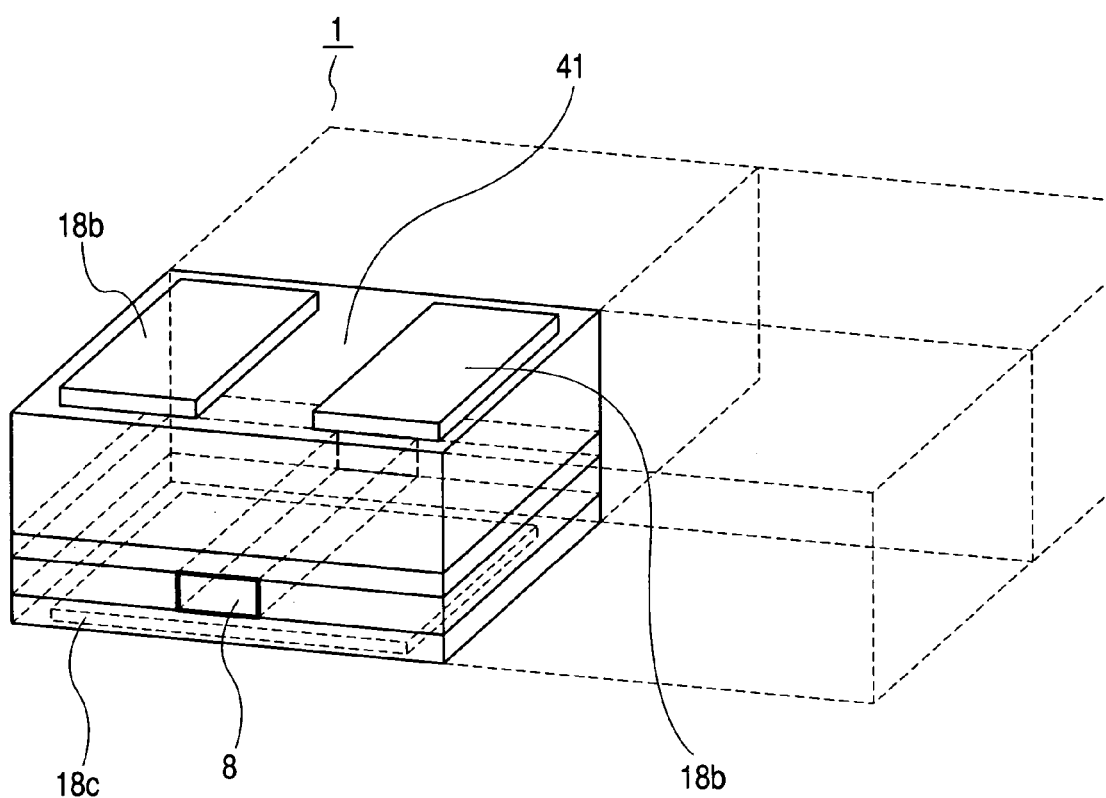
FIG. 6 is an outline view of a laser diode chip according to the third embodiment of the invention.

FIG. 6 is an expanded view in which the laser diode chip 1 is cut out. The aperture 41 is located above oscillator 8, and the shape of the aperture 41 is formed so that the irradiation of the laser light 13 to the oscillator 8 is not interrupted. The upper electrode 6 is mounted onto the surface of the wafer 2 in which the laser diode chip 1 is formed, and the lower electrode 7 and the lead-out portion 5 are mounted onto the surface of the wafer 2 in which the laser diode chip 1 is not formed. The aperture through which the oscillator 8 can be irradiated with the laser light 13 is previously secured above the oscillator 8, which allows the same inspection as in the first and second embodiments to be performed. Further, in the third embodiment, it is possible to complete up to the process in which the single-chip electrodes 18b and 18c are previously formed. Therefore, the third embodiment also contributes to the simplification of the manufacturing process.

Although the preferred embodiments were described above, the method and apparatus for inspecting a semiconductor device chip wafer of the invention are not limited to the mode which utilizes the thermo-electromotive force generated by the irradiation of the laser light. The method in which the current is passed through the wafer 2 of the inspection subject and the wafer 2 is irradiated with the laser light 13 can be thought as an example. This method utilizes temperature dependence on resistance value as a principle of the defect detection. Namely, the temperature is increased in a part irradiated with the laser light 13 and the electrical resistance is changed in the part in accordance with the increase in temperature. However, when the wafer 2 has the crystal defect, the part in which the crystal defect is located differs from the normal part in the change in an electrical resistance. For example, when the wafer 2 has the defect such as a void, the thermal productivity becomes worse and the difference between the defective part and the normal part is generated in the temperature rise or the change in electrical resistance. The defect point can be specified on the basis of the above-described principle. In this case, in order to increase the detection sensitivity, and in order to decrease the amount of current in the state in which the wafer 2 is not irradiated with the laser light 13, it is also effective that the temperature of the wafer 2 is controlled by the temperature control unit 24.

The cases in which the invention is applied to the method of detecting the defect in a crystalline structure of the compound-semiconductor laser diode chip were described in the embodiments. However, the invention is not limited to the above-described embodiments, and the invention can be applied to other semiconductor devices. Further, the invention is effective when the inspection is performed by using the quantum beam such as an electron beam and an ion beam in addition to the laser light.

What is claimed is:

1. A method of inspecting a semiconductor device chip wafer, said method comprising:
   a step of passing a constant current between a surface and a backside of a wafer in which semiconductor device chips are integrated;
   a step of irradiating the wafer with a quantum beam having a wavelength which is transmitted through an inside of a crystal of the wafer and does not generate an electromotive force due to excitation while the quantum beam is scanned;
   a step of detecting a change in current generated by irradiating a crystalline abnormal part of the wafer and of displaying the change in current, wherein the display is performed by displaying a relationship between an irradiation position of the quantum beam and the change in voltage or current corresponding to the irradiation position in a form of a display image; and
   a step of previously providing a single-chip electrode of each laser diode chip in only one of the surface of and the backside of the wafer, wherein the semiconductor device is a semiconductor laser diode, and the irradiation is performed from the surface in which the single-chip electrode is not provided.

2. A method of inspecting a semiconductor device chip wafer, said method comprising:
   a step of passing a constant current between a surface and a backside of a wafer in which semiconductor device chips are integrated;
   a step of irradiating the wafer with a quantum beam having a wavelength which is transmitted through an inside of a crystal of the wafer and does not generate an electromotive force due to excitation while the quantum beam is scanned;
   a step of detecting a change in current generated by irradiating a crystalline abnormal part of the wafer and of displaying the change in current, wherein the display is performed by displaying a relationship between an irradiation position of the quantum beam and the change in voltage or current corresponding to the irradiation position in a form of a display image; and
   a step of previously providing a single-chip electrode having an aperture along an oscillator of each laser diode chip in at least one of the surface and the backside of the wafer, wherein the semiconductor device is a semiconductor laser diode having the oscillator, and the irradiation is performed through the aperture.

3. The inspection method according to claim 1, further comprising a step of previously dividing the wafer into a plurality of pieces, wherein the irradiating step and the detecting and displaying step are performed in each of the divided wafers.

4. The inspection method according to claim 2, further comprising a step of previously dividing the wafer into a plurality of pieces, wherein the irradiating step and the detecting and displaying step are performed in each of the divided wafers.

* * * * *